(12) United States Patent
He et al.

(10) Patent No.: US 9,307,684 B2
(45) Date of Patent: Apr. 5, 2016

(54) LIQUID CRYSTAL DISPLAY PANEL COMPRISING AT LEAST ONE SHIELDING LAYER HAVING OPENINGS POSITIONED ABOVE A PLURALITY OF SIGNAL LEADS

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Wei He, Beijing (CN); Xinghua Li, Beijing (CN); Seung Yik Park, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 233 days.

(21) Appl. No.: 13/822,143

(22) PCT Filed: Nov. 29, 2012

(86) PCT No.: PCT/CN2012/085527
§ 371 (c)(1),
(2) Date: Mar. 11, 2013

(87) PCT Pub. No.: WO2013/166824
PCT Pub. Date: Nov. 14, 2013

(65) Prior Publication Data
US 2014/0111723 A1    Apr. 24, 2014

(30) Foreign Application Priority Data
May 11, 2012 (CN) .......................... 2012 1 0146879

(51) Int. Cl.
*G02F 1/1345* (2006.01)
*H05K 9/00* (2006.01)
*G02F 1/1362* (2006.01)

(52) U.S. Cl.
CPC .......... *H05K 9/0064* (2013.01); *G02F 1/13452* (2013.01); *G02F 1/136204* (2013.01); *G02F 1/136286* (2013.01); *G02F 2001/136218* (2013.01)

(58) Field of Classification Search
CPC .............. H05K 9/0064; G02F 1/13452; G02F 2001/136218
USPC .................................. 349/110, 111, 149–152
See application file for complete search history.

(56) References Cited

U.S. PATENT DOCUMENTS

| 2002/0101553 A1 | 8/2002 | Enomoto et al. | |
|---|---|---|---|
| 2008/0094562 A1* | 4/2008 | Lee et al. | 349/153 |

(Continued)

FOREIGN PATENT DOCUMENTS

| CN | 1515944 A | 7/2004 |
|---|---|---|
| CN | 101178525 A | 5/2008 |

(Continued)

OTHER PUBLICATIONS

International Search Report dated Feb. 26, 2013; PCT/CN2012/085527.

(Continued)

*Primary Examiner* — Paul Lee
(74) *Attorney, Agent, or Firm* — Ladas & Parry LLP

(57) ABSTRACT

The present invention provides a liquid crystal display (LCD) panel and a LCD apparatus. The LCD panel has a display region and a periphery region and comprises an array substrate and a color filter substrate opposite to each other, the array substrate has a plurality of pixel regions defined by intersecting signal lines in the display region, each pixel region comprises a thin film transistor, and signal leads are connected to the signal lines and disposed in the periphery region. Wherein, the LCD panel further comprises at least one shielding layer located in the periphery region, which is grounded and electrically conductive. The LCD apparatus comprises the LCD panel.

10 Claims, 4 Drawing Sheets

(56) References Cited

U.S. PATENT DOCUMENTS

| | | |
|---|---|---|
| 2008/0204619 A1 | 8/2008 | Saitou et al. |
| 2009/0121991 A1 | 5/2009 | Chung et al. |
| 2009/0268132 A1 | 10/2009 | Takama et al. |

FOREIGN PATENT DOCUMENTS

| | | |
|---|---|---|
| CN | 101251695 A | 8/2008 |
| CN | 101384157 A | 3/2009 |
| CN | 101571633 A | 11/2009 |
| CN | 101576693 A | 11/2009 |
| CN | 102243405 A | 11/2011 |
| CN | 202120009 U | 1/2012 |
| CN | 102681250 A | 9/2012 |
| WO | 03/077021 A1 | 9/2003 |

OTHER PUBLICATIONS

First Chinese Office Action dated Mar. 31, 2014; Appln. No. 201210146879.1.

Second Chinese Office Action Appln. No. 201210146879.1; Dated Aug. 27, 2014.

International Preliminary Report on Patentability dated Nov. 11, 2014; PCT/CN2012/085527.

* cited by examiner

LIQUID CRYSTAL DISPLAY PANEL COMPRISING AT LEAST ONE SHIELDING LAYER HAVING OPENINGS POSITIONED ABOVE A PLURALITY OF SIGNAL LEADS

TECHNICAL FIELD

Embodiments of the present invention relate to a liquid crystal display (LCD) panel and a LCD apparatus having the same.

BACKGROUND

A LCD panel comprises an array substrate and a color filter substrate opposite to each other with liquid crystal material interposed therebetween. The LCD panel comprises a display region for displaying and a periphery region outside one side edge of the display region. A plurality of gate lines and a plurality of source lines are vertical to each other and are disposed within the display region of the array substrate, and a thin film transistor array is formed at respective intersections of the gate lines and source lines to drive pixel units for display. Gate leads and source leads are disposed in the periphery region of the array substrate so as to connect the gate and source lines to gate and source driving units, respectively, and black matrix (BM) is disposed in the periphery region of the color filter substrate. In each thin film transistor, a source electrode is connected to the source line, a gate electrode is connected to the gate line, and a drain electrode is connected to a pixel electrode. Liquid crystal molecules are driven to display images by controlling a voltage between the pixel electrode and a common electrode. According to the position of the common electrode, the LCD panel may be divided into vertical electric field LCD panel and horizontal electric field LCD panel.

Vertical electric field LCD panel comprises twisted nematic (TN) LCD panel, vertical alignment (VA) LCD panel, or the like, in which the common electrode is disposed on the color filter substrate, so that an electric field generated by the common electrode and the pixel electrode is vertical to the array substrate.

Horizontal electric field LCD panel comprises in-plane switching (IPS) LCD panel and fringe field switching (FFS, also referred as ADS) LCD panel, in which the common electrode is disposed on the array substrate, so that an electric field generated by the common electrode and the pixel electrode is substantially parallel to the array substrate. In IPS LCD panel, the pixel electrodes and the common electrodes are shaped into stripe and alternatively arranged at intervals. In FFS LCD panel with advanced fringe field switching (AFFS) mode, the common electrode is plate in shape, and a plurality of stripe pixel electrodes are disposed on the common electrode with an insulating layer interposed between the common electrode and the stripe pixel electrodes. In FFS LCD panel with high-aperture ratio of fringe field switching (HFFS) mode, as shown in FIG. 1, the pixel electrode 6 is plate in shape, and a plurality of stripe common electrodes 7 are disposed on the pixel electrode 6 at intervals with an insulating layer 8 therebetween.

As shown in FIG. 1, when the LCD panel is activated, initialization should be performed at first. At this time, the voltage of each of gate leads 42 is changed from 0V into positive value (e.g., 15V), so that a large induced electromagnetic field is generated in periphery region 92. Induced charges are generated on black matrix 22 (i.e., above the gate leads 42) of the periphery region 92 in the color filter substrate 2 due to the induced electromagnetic field, and may disperse into edges of the display region 91. With respect to the horizontal electric field LCD panel, the induced charges may be accumulated at edges of the display region 91 and affect the distribution of electric field, so that undesired rotation of the liquid crystal molecules occurs, and thus white lines are emerged at edges of the display region 91 and the display quality is reduced. When the panel starts displaying normally, the voltage of the gate leads 41 is changed line by line in scanning manner, so the induced electromagnetic field is reduced and the induced charges gradually drop away, and thus the white lines are disappeared.

In order to eliminate the white lines during activating the horizontal electric field LCD panel, there mainly are two ways in prior art. One is to delay in turning on the backlight source, that is, the backlight source is closed when the induced charges are being accumulated, so that users can not see the white lines. The other is to increase the width of the periphery region, and simultaneously increase the distance between the gate leads or the distance between the gate leads and the display region, so that the intensity of the induced electromagnetic field is decreased, or the induced charges is prevented from dispersing into the display region.

The applicant found the following problems in the prior art: with respect to delaying in turning on the backlight source, the activating time becomes longer, which adversely affects user's visual experience and the display quality is reduced; with respect to increasing the width of the periphery region, it must lead to a decrease in utilization of the periphery region, so the size of the LCD panel and the cost are both increased. That is, the existed methods can not essentially solve the problem about the white lines during activating the horizontal electric field LCD panel.

SUMMARY

An embodiment of the present invention provides a liquid crystal display (LCD) panel having a display region and a periphery region and comprising an array substrate and a color filter substrate opposite to each other, wherein the array substrate comprises a plurality of pixel regions defined by intersecting signal lines in the display region, each pixel region comprises a thin film transistor, and signal leads are disposed in the periphery region and connected to the signal lines; the LCD panel further comprising: at least one shielding layer located in the periphery region, which is grounded and electrically conductive.

Another embodiment of the present invention provides a LCD apparatus including the above LCD panel.

BRIEF DESCRIPTION OF THE DRAWINGS

In order to clearly illustrate the technical solution of the embodiments of the present invention, the drawings of the embodiments will be briefly described in the following; it is obvious that the described drawings are only related to some embodiments of the invention and thus are not limitative of the present invention.

DETAILED DESCRIPTION

Figure 1:
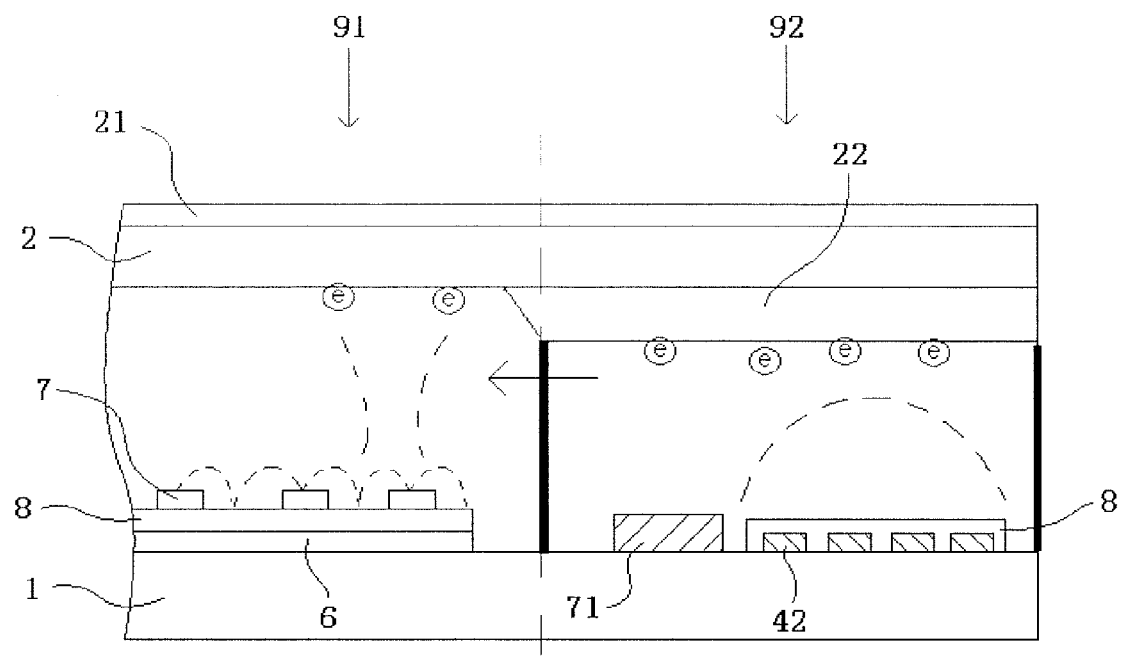
FIG. 1 is a partially sectional view illustrating a structure at an interface between a display region and a periphery region of an existed LCD panel (in FFS mode)

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

First Embodiment

The present embodiment provides a LCD panel having a display region and a periphery region and comprising an array substrate and a color filter substrate opposite to each other. Gate lines and source lines are intersected with each other to define a plurality of pixel regions in the display region on the array substrate. A thin film transistor is disposed in each pixel region. Gate leads connected to the gate lines are disposed in the periphery region. The LCD panel further comprises:

a shielding layer located in the periphery region, which is grounded and electrically conductive, so as to shield an induced electromagnetic field caused by a voltage change of the gate leads.

In the LCD panel of the present embodiment, an electrically conductive and shielding layer is disposed in the periphery region, so induced charges caused by the induced electromagnetic field can be generated in the shielding layer and discharged by the shielding layer rapidly. Thus, the induced charges can not be dispersed into the display region, and the white lines phenomenon will not occur.

Second Embodiment

The present embodiment provides a LCD panel, as shown in FIGS. 2 to 5, which comprises a display region 91 for displaying and a periphery region 92 outside at least one side edge of the display region 91 (the present embodiment illustrates the periphery region 92 outside both opposite side edges of the display region 91 as an example).

The LCD panel comprises an array substrate 1 and a color filter 2 opposite to each other, and a liquid crystal material interposed therebetween.

A plurality of gate lines and source lines (not illustrated in drawings) vertical to each other are disposed in the periphery region 92 on the array substrate 1. The intersection points of the gate lines 41 and source lines define thin film transistors in an array (not illustrated in drawings). The gate lines 41 are connected to the gate electrodes of the thin film transistors, the source lines are connected to the source electrodes of the thin film transistors, the drain electrodes of the thin film transistors are connected to pixel electrodes 6. The voltages of the pixel electrodes 6 are controlled by adjusting the voltages of the gate lines 41 and of the source lines, so that diversity voltage differences between the pixel electrodes 6 and common electrodes 7 are generated, thereby drive liquid crystal molecules for displaying. The gate leads 42 connected to the gate lines 41 are disposed in the periphery region 92 of the array substrate 1, and are used for connecting the gate lines 41 to a gate driving unit 43.

The LCD panel of the present embodiment further comprises: a shielding layer 3 in the periphery region 92 on the array substrate 1, which is grounded and electrically conductive and is used for shielding an induced electromagnetic field caused by the voltage change of the gate leads 42. The shielding layer 3 covers at least part of the gate leads 42, and an insulating layer 8 is disposed between the gate leads 42 and the shielding layer 3 to prevent from forming an electrical conduction therebetween. Meanwhile, the shielding layer 3 is provided with openings 31 located above at least portion of the gate leads 42. The grounding of the barrier layer 3 can be achieved by connecting the shielding layer 3 to a ground terminal 32 which is originally existed in the LCD panel, for example, by connecting the shielding layer 3 to a ground site, or by connecting the shielding layer 3 to a back electrode (back ITO) 21 on the color filter substrate 2. Since the ground terminal 32 of the LCD panel is known, so the detailed description is omitted. As the electrically conductive and shielding layer 3 can shield the induced electromagnetic field caused by a voltage change of the gate leads 42, and discharge the induced charges generated by the induced electromagnetic field rapidly, the induced charges can not disperse into the display region 91.

However, the shielding layer 3 is actually equivalent to a pole piece facing to the gate leads 42, and it may also possible to face to a common electrode lead 71, source leads (not illustrated in drawing), or the like. Therefore, parasitic capacitances may be generated between the shielding layer 3 and respective lead, thus a RC delay may occur, and as a result, the signal in respective lead may be delayed and blocked, and the display duration is affected. The value of the parasitic capacitance is presented as follow: $C=(\epsilon \times S)/(4\pi \times k \times d)$, in which $\epsilon$, $k$, and $\pi$ are constants, S is an area of the portion of the capacitor pole pieces facing with each other, and d is a distance between the capacitor pole pieces. From it we see that the openings 31 provided in the shielding layer 3 is equivalent to the reduction in the area of the portion of capacitor pole pieces facing with each other, between which the parasitic capacitance is generated, so that the parasitic capacitance value is reduced, the RC delay caused by the shielding layer 3 is decreased, and the white line problem during the activation can be solved without deteriorating the display quality.

Figure 5:
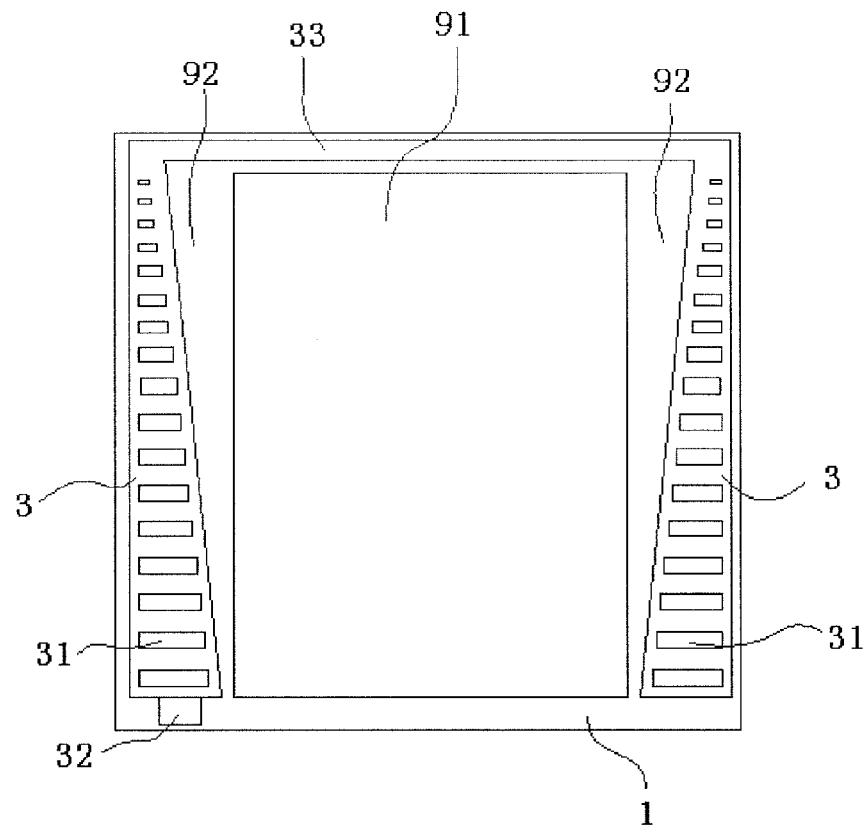
FIG. 5 is a schematic top view illustrating the array substrate of the LCD panel according to the second embodiment of the present invention.

For example, as shown in FIG. 5, the shielding layer 3 is provided with a plurality of openings 31 in the shape of strip, and the length direction of the openings 31 is vertical to the gate leads 42. The openings 31 have the following advantages: not only reducing the area of the portion of the gate leads 42 facing with the shielding layer 3, but also insuring that portions of each gate lead 42 covered by the shielding layer 3 and portions of each gate lead 42 located below the openings 31 are distributed at uniform intervals, so the shielding effect is uniform. If the length direction of the openings 31 is parallel to the gate leads 42, some gate leads 42 may be completely below the opening 31, so that the shielding effect is poor; while other gate leads 42 may be completely covered by the shielding layer 3, so that the RC delay become more serious. Therefore, the arrangement in which the openings 31 are parallel to the gate leads 42 is not preferable. Of course, if the opening 31 is formed in other shapes, the above effect can also be realized.

For example, the shielding layer 3 can be made of indium tin oxide (ITO) which is transparent. Thus, it will not affect the light curing process for seal agents after the shielding layer 3 is formed. Of course, due to the opening 31, the shielding layer 3 also can be made of other electrically conductive material, such as, metal or the like.

For example, the LCD panel of the present embodiment is horizontal electric field LCD panel, such as, IPS LCD panel or FFS LCD panel.

Figure 3:
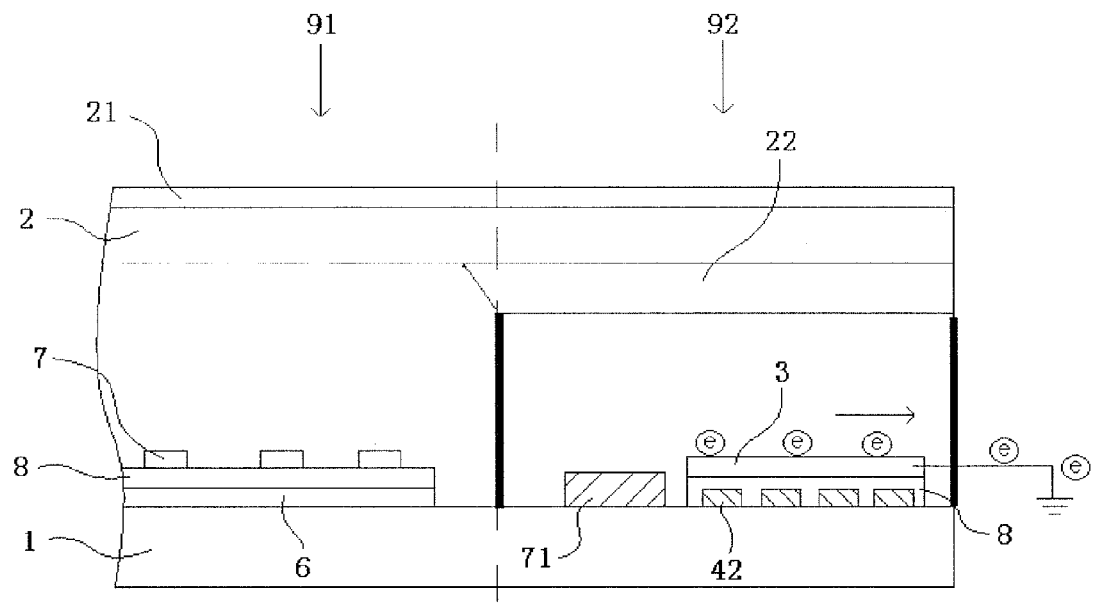
FIG. 3 is a partially sectional view illustrating a structure at an interface between the display region and the periphery region of the LCD panel (in FFS mode) according to the second embodiment of the present invention.

The FFS LCD panel is illustrated in FIG. 3, in which the pixel electrode 6 is plate in shape, the insulating layer 8 is formed thereon, and a plurality of strip-shaped common electrodes 7 are formed on the insulating layer 8 and spaced apart from each other. Preferably, the shielding layer 3 can be formed in the same photolithographic process as the common electrodes 7. Alternatively, the FFS LCD panel has the following structure: the common electrode 7 is plate in shape, the insulating layer 8 is formed thereon, and a plurality of strip-shaped pixel electrodes 6 are formed on the insulating layer 8 and spaced apart from each other (not illustrated in drawings). In this case, the shielding layer 3 can be formed in the same photolithographic process as the pixel electrodes 6. In other words, the shielding layer 3 can be formed in the same photolithographic process as the upper one (or referred as the $2^{nd}$ electrode) of the pixel electrode 6 and the common electrode 7 in the FFS LCD panel. When forming the $2^{nd}$ electrode and the shielding layer in the same photolithographic process, it only needs to vary the pattern of the mask plate without adding any individual process, so the existed procedure for manufacturing LCD panel is not modified, and the manufacturing process is simple and easily performed. Of course, it is also conceivable that the shielding layer 3 can be formed in the same photolithographic process as other structures, or formed in an individual process.

Figure 4:
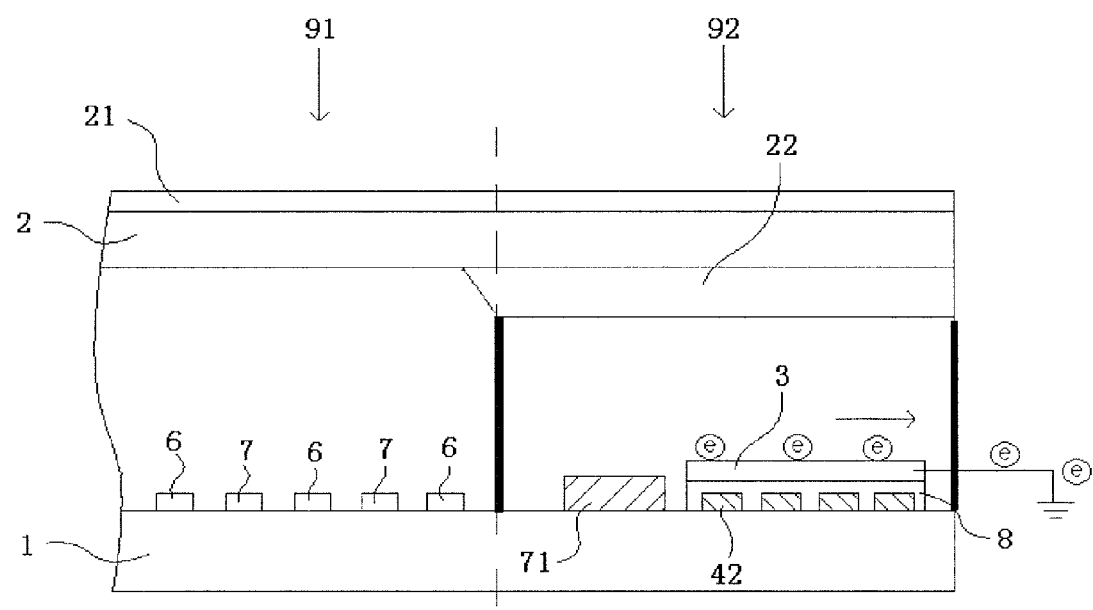
FIG. 4 is a partially sectional view illustrating a structure at an interface between the display region and the periphery region of the LCD panel (in IPS mode) according to the second embodiment of the present invention.

As shown in FIG. 4, in IPS LCD panel, both the pixel electrodes 6 and the common electrodes 7 are shaped into strip and alternatively arranged at intervals. Since both of the pixel electrodes 6 and the common electrodes 7 are formed in a same layer, so the shielding layer 3 may be formed in the same process as either of them.

As shown in FIG. 5, for example, the periphery region 92 can be formed outside both opposite side edges of the display region 91, and the shielding layers 3 located in the respective portion of the periphery region are electrically connected to each other via a connection part 33. The connection part 33 shown in FIG. 5 is positioned above the display region 91, it is conceivable that the connection part 33 can be arranged in any other position. The periphery region 92 formed outside both opposite side edge of the display region 91 allows the gate leads 42 from two sides of the display region 91 to connect with the gate lines 41, so the density of the leads in the periphery region 92 is reduced. This configuration can be also used in LCD panel field (especially in small-size LCD panel used for such as cell phone). The electrically connection between the two shielding layers 3 formed in two portions of the periphery region 92 has the following advantageous: it only needs one ground terminal 32 to make the two shielding layers 3 grounded, so the structure is simple. If the two shielding layers 3 are further connected to the two ground terminals 32, respectively, the induced charges in the shielding layers 3 can be discharged via both of the ground terminals 32 uniformly, so the risk of failing in discharging caused by a poor contact in any one of the ground terminals 32 can be avoided. For example, the two shielding layers 3 can be connected together by one connection part 33. If there are plural connection parts 33, the shielding layers 3 form a closed loop to constitute a coil-like structure; as a result, a current caused by the induced electromagnetic field may be generated inside the coil-like structure, which adversely affects the shielding effect.

Figure 2:
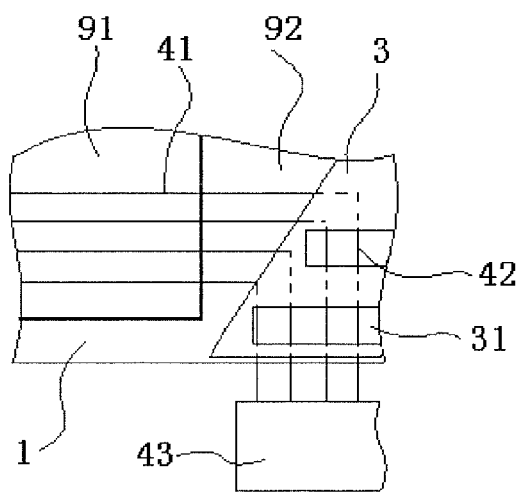
FIG. 2 is a partial top view illustrating a structure at an interface between a display region and a periphery region of an array substrate of a LCD panel according to a second embodiment of the present invention.

For example, as shown in FIG. 2, in the periphery region 92 connected to one side edge of the display region 91, one end of each gate lead 42 is connected to the gate driving unit 43 in a direction parallel to the side edge, the other end is connected to the gate line 41. That is, each gate lead 42 is parallel to the side edge of the display region 92, a lower end of each gate lead 42 is connected to the gate driving unit 43 (such as, gate driving chip), and an upper end is connected to the gate line 41 at respective position. At this time, as shown in FIGS. 2 and 5, in a direction from one end (input) of the gate lead 42 connected with the gate driving unit 43 to one end (output) connected with the gate line 41, the width of the shielding layer 3 is tapered in the periphery region 92. It is found from practice that, the white line caused by the induced charges during activating the LCD panel is relative wide at the end of the display region 91 adjacent to the input of the gate lead 42, and is relative narrow at the end thereof adjacent to the output of the gate lead 42, that is, the induced charge problem is more serious at the input of the gate lead 42. Therefore, the shielding layer 3 preferably has a large width at the input end of the gate lead 42 (to achieve a strong shielding effect), and has a small width at the output end of the gate lead 42 (to achieve a weak shielding effect), so that the parasitic capacitance is minimized and the shielding effect can be ensured.

Alternatively, the gate driving unit 43 in the LCD panel can also be located at another side of the periphery region 92 which is opposite to the display region 91, so that the gate leads 42 is vertical to the vertical side edge of the display region 91. With respect to such a structure, the shielding layer 3 of the present embodiment is also suitable, except the direction of the openings 31 of the shielding layer 3 preferably rotate 90 degree, and the width of the openings 31 does not need to change.

Of course, the LCD panel of the present embodiment may further comprise other conventional components used in the LCD panel, such as, spacers, color filters, a source driving chip, etc. It should be noted that in some of the drawings, the components which has little correlation to the main structure (i.e. the structure desired to be shown in the drawings) are not illustrated (e.g., the gate lines, gate leads, gate driving units, or the like are not illustrated in FIG. 5).

Third Embodiment

Figure 6:
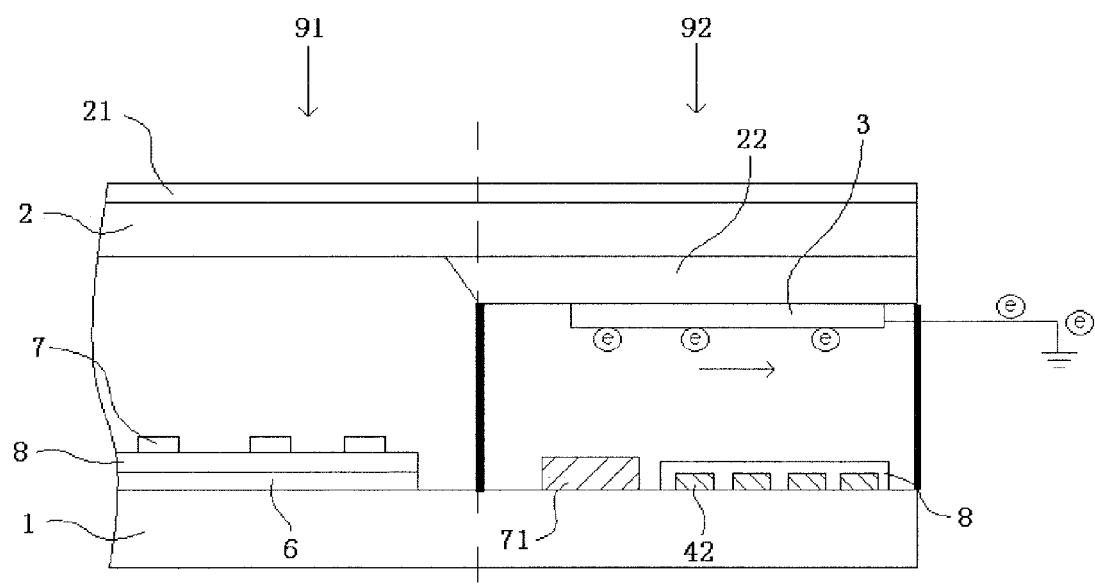
FIG. 6 is a partially sectional view illustrating a structure at an interface between a display region and a periphery region of a LCD panel according to a third embodiment of the present invention.
Figure 7:
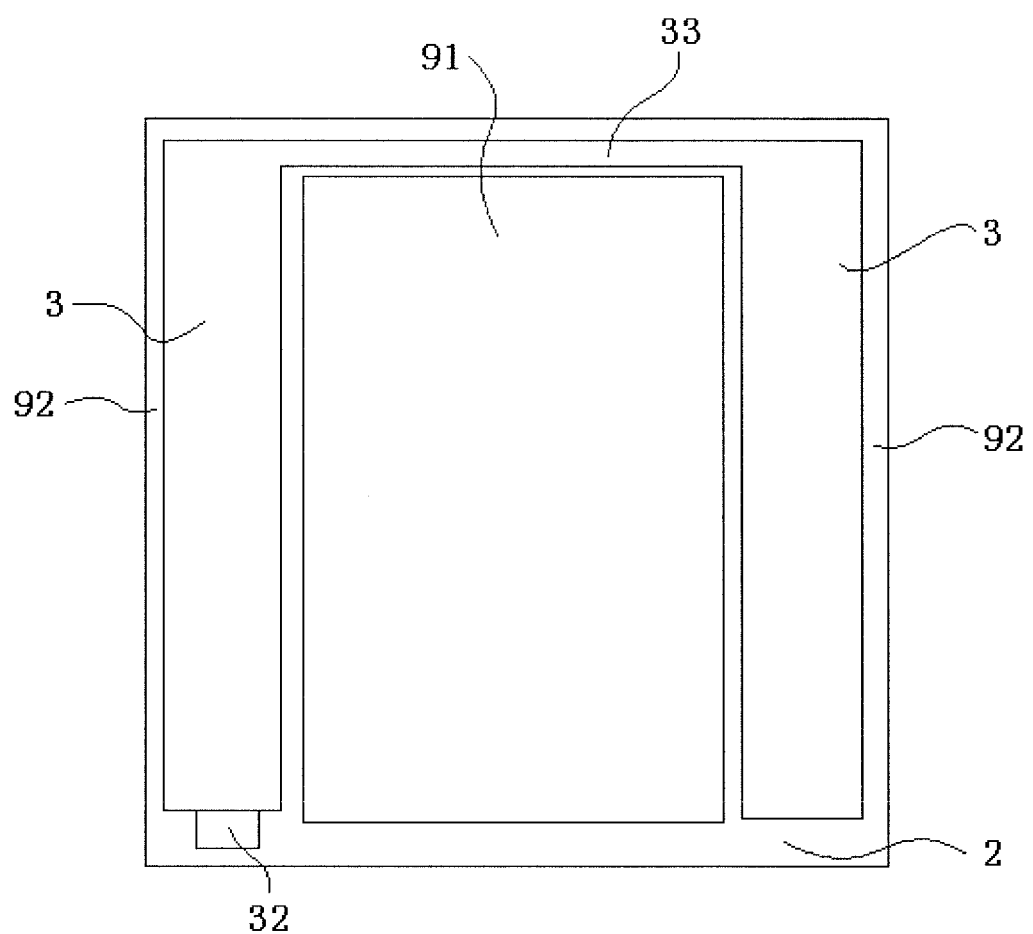
FIG. 7 is a schematic top view illustrating a color filter substrate of the LCD panel according to the third embodiment of the present invention.

The present embodiment provides a LCD panel having a similar structure as that in the second embodiment, and the difference from the LCD panel of the second embodiment in that: in the LCD panel of the present embodiment, the shielding layer 3 is not formed on the array substrate 1, but formed on the color filter substrate 2 (still in the periphery region 92), as shown in FIGS. 6 and 7.

As shown in FIG. 7, since the shielding layer 3 on the color filter substrate 2 has a larger distance (i.e., the distance d is larger) away from each lead (e.g., the gate lead 42) on the array substrate 1, the parasitic capacitance therebetween is smaller in itself, and thus in this embodiment, the shielding layer 3 does not need to have the openings 31 and the width also need not to be tapered. Of course, it is also feasible to apply the structures, such as, the opening 31, the tapered width, etc. to the shielding layer 3 on the color filter substrate 2.

Fourth Embodiment

The present embodiment provides a LCD apparatus comprising the LCD panel according to any one of embodiments described as above.

Since the LCD apparatus of the present embodiment comprises the above described LCD panel, the white line problem during activating the LCD panel can be solved.

Of course, the LCD apparatus of the present embodiment may further comprise other conventional structures used in the LCD apparatus, such as, a power source unit, a back light source, frame housing, etc.

Although the above embodiments are described by using the shielding layer covering at least part of the gate leads as an example, the scope of the present invention are not limit thereto. For example, the shielding layer can shield the induced electromagnetic field caused by other signal leads in the periphery region, including but not limited to: source leads and common electrode leads, which are located in the periphery region and connected to the respective signal lines, such as the source lines and the common electrode lines in the display region. The shielding layer for shielding the induced electromagnetic field caused by these signal leads can have the same or similar arrangement and effect as the above described shielding layer has, so the detailed description is omitted here.

The embodiments according to the present invention provide at least the following structure and method:

(1) a LCD panel having a display region and a periphery region and comprising an array substrate and a color filter substrate opposite to each other, wherein the array substrate comprises a plurality of pixel regions defined by intersecting signal lines in the display region, each pixel region comprises a thin film transistor, and signal leads are disposed in the periphery region and connected to the signal lines; the LCD panel further comprising, at least one shielding layer located in the periphery region, which is grounded and electrically conductive.

(2) the LCD panel according to (1), wherein, the at least one shielding layer is formed on the array substrate and covers at least part of the signal leads, and an insulating layer is disposed between the at least one shielding layer and the signal leads.

(3) the LCD panel according to (2), wherein, the at least one shielding layer is provided with openings positioned above at least the signal leads.

(4) the LCD panel according to (3), wherein, the openings of the at least one shielding layer are plural and in the shape of strip, the length direction of the openings is vertical to the signal leads.

(5) the LCD panel according to (1), wherein, the at least one shielding layer is formed on the color filter substrate, and located in an area opposite to at least a part of the signal leads.

(6) the LCD panel according to any one of (1) to (5), wherein, the signal lines comprise at least one of the following lines: gate lines, source lines, and common electrode lines, and the signal leads comprise at least one of the following leads: gate leads connected to the gate lines, source leads connected to the source lines, and common electrode leads connected to the common electrode lines.

(7) the LCD panel according to any one of (1) to (6), wherein, the at least one shielding layer is used for shielding an induced electromagnetic field caused by a voltage change of the signal leads.

(8) the LCD panel according to any one of (1) to (7), wherein, the periphery region is formed outside both opposite sides of the display region, two shielding layers are provided in the periphery region and electrically connected to each other via a connection part.

(9) the LCD panel according to any one of (1) to (8), wherein, the periphery region is formed outside at least one side edge of the display region, and in a direction parallel to the side edge of the display region, one end of the signal leads in the periphery region is connected to the driving unit, the other end thereof is connected to the signal lines;

in a direction from the end of the signal leads connected with the driving unit to the ends thereof connected with the corresponding signal lines, a width of the at least one shielding layer is tapered in the periphery region.

(10) the LCD panel according to any one of (1) to (9), wherein, the at least one shielding layer is made of indium tin oxide material.

(11) the LCD panel according to any one of (1) to (10), wherein, the LCD panel is IPS LCD panel or FFS LCD panel.

(12) the LCD panel according to any one of (1) to (11), wherein, the LCD panel is FFS LCD panel, wherein, plate-shaped pixel electrodes are formed on the array substrate, an insulating layer is formed on the pixel electrodes, common electrodes are formed in strip shape on the insulating layer and spaced apart from each other, and the at least one shielding layer and the common electrodes are formed in the same photolithographic process;

or plate-shaped common electrodes are formed on the array substrate, an insulating layer is formed on the common electrodes, pixel electrodes are formed in strip shape on the insulating layer and spaced apart from each other, and the at least one shielding layer and the pixel electrodes and formed in the same photolithographic process.

(13) a LCD apparatus including the LCD panel according to any one of (1) to (12).

What are described above is related to the illustrative embodiments of the disclosure only and not limitative to the scope of the disclosure; the scopes of the disclosure are defined by the accompanying claims.

The invention claimed is:

1. A liquid crystal display (LCD) panel having a display region and a periphery region and comprising an array substrate and a color filter substrate opposite to each other, wherein the array substrate comprises a plurality of pixel regions defined by intersecting signal lines in the display region, each pixel region comprises a thin film transistor, and signal leads are disposed in the periphery region and connected to the signal lines; the LCD panel further comprising:

at least one shielding layer located in the periphery region, which is grounded and electrically conductive, wherein, the at least one shielding layer is formed on the array substrate and covers at least part of the signal leads, and an insulating layer is disposed between the at least one shielding layer and the signal leads; and wherein openings are positioned in the at least one shielding layer above at least the signal leads.

2. The LCD panel according to claim 1, wherein,
the openings of the at least one shielding layer are plural and in the shape of strip, the length direction of the openings is vertical to the signal leads.

3. The LCD panel according to claim 1, wherein,
the signal lines comprise at least one of the following lines: gate lines, source lines, and common electrode lines, and the signal leads comprise at least one of the following leads: gate leads connected to the gate lines, source leads connected to the source lines, and common electrode leads connected to the common electrode lines.

4. The LCD panel according to claim 1, wherein,
the at least one shielding layer is used for shielding an induced electromagnetic field caused by a voltage change of the signal leads.

5. The LCD panel according to claim 1, wherein,
the periphery region is formed outside both opposite sides of the display region, two shielding layers are provided in the periphery region and electrically connected to each other via a connection part.

6. The LCD panel according to claim 1, wherein,
the periphery region is formed outside at least one side edge of the display region, and in a direction parallel to the side edge of the display region, one end of the signal leads in the periphery region is connected to the driving unit, the other end thereof is connected to the signal lines;
in a direction from the end of the signal leads connected with the driving unit to the ends thereof connected with the corresponding signal lines, a width of the at least one shielding layer is tapered in the periphery region.

7. The LCD panel according to claim 1, wherein,
the at least one shielding layer is made of indium tin oxide material.

8. The LCD panel according to claim 1, wherein,
the LCD panel is in-plane switching LCD panel or fringe field switching LCD panel.

9. The LCD panel according to any claim 7, wherein, the LCD panel is fringe field switching LCD panel, wherein,
plate-shaped pixel electrodes are formed on the array substrate, an insulating layer is formed on the pixel electrodes, common electrodes are formed in strip shape on the insulating layer and spaced apart from each other, and the at least one shielding layer and the common electrodes are formed in the same photolithographic process; or
plate-shaped common electrodes are formed on the array substrate, an insulating layer is formed on the common electrodes, pixel electrodes are formed in strip shape on the insulating layer and spaced apart from each other, and the at least one shielding layer and the pixel electrodes and formed in the same photolithographic process.

10. A liquid crystal display (LCD) apparatus including the LCD panel according to claim 1.

* * * * *